United States Patent [19]

Düllberg et al.

[11] Patent Number: 5,703,545
[45] Date of Patent: Dec. 30, 1997

[54] HIGH FREQUENCY FILTER CIRCUIT

[75] Inventors: Gerald Düllberg, Iserlohn; Herbert Peusens, Brigachtal; Veit Armbruster, Georgen, all of Germany

[73] Assignee: Deutsche Thomson-Brandt GmbH, Villingen-Schwenningen, Germany

[21] Appl. No.: 613,423

[22] Filed: Mar. 11, 1996

[30] Foreign Application Priority Data

Mar. 17, 1995 [DE] Germany ............ 195 09 644.4

[51] Int. Cl.$^6$ ............................................. H01P 1/20
[52] U.S. Cl. .................... 333/202; 333/175; 455/302; 455/198.1; 455/282
[58] Field of Search .................... 333/167, 175, 333/176, 202; 455/189.1, 190.1, 198.1, 205, 280–282, 290, 302

[56] References Cited

U.S. PATENT DOCUMENTS

| | | | |
|---|---|---|---|
| 3,562,417 | 2/1971 | Poppa | 333/176 |
| 4,182,997 | 1/1980 | Brambilla | 333/176 |
| 4,188,598 | 2/1980 | Hunt | 333/176 |
| 4,315,333 | 2/1982 | Yamashita et al. | 455/189 |
| 4,340,975 | 7/1982 | Onishi et al. | 455/315 |
| 4,516,270 | 5/1985 | Phillips | 455/302 |
| 4,547,901 | 10/1985 | Shibata et al. | 455/300 |
| 5,170,493 | 12/1992 | Roth | 455/282 |
| 5,245,300 | 9/1993 | Sasaki et al. | 333/167 |

FOREIGN PATENT DOCUMENTS 4-243306 of 0000 Japan.

OTHER PUBLICATIONS

Funkschau 1976, Heft 7 E. Koch, Fernseh-Tuner MIT Neuartigem Schaltungskonzept Pur Empfanger An Grob-Gemeinschaftsantennen-Analgen (GGA) 255-256 German Search Report No Month.

*Primary Examiner*—Benny Lee
*Attorney, Agent, or Firm*—Joseph S. Tripoli; Frederick A. Wein; Peter M. Emanuel

[57] ABSTRACT

A filter circuit having an amplifier stage, an upstream filter and a downstream bandpass filter. The filter includes, inter alia, a rejection circuit tuned to an intermediate frequency and a series circuit, tuned to an image frequency and formed by a capacitor and a $\lambda/4$ coaxial stub. The inductance formed by the coaxial stub is shared by the series circuit and the rejection circuit.

16 Claims, 2 Drawing Sheets

HIGH FREQUENCY FILTER CIRCUIT

BACKGROUND

When a radio-frequency signal has an oscillator signal heterodyned with it in a mixer stage, two mixing products occur, namely the sum and the difference of the frequencies of the signals. If one of these frequencies is assigned to a wanted signal, the other frequency is called the image frequency.

If the wanted frequency and the image frequency are close to one another, then stringent requirements are placed on the selection means of a downstream amplifier, which requirements can no longer be satisfied just by a simple two-circuit bandpass filter.

In the case of double-conversion tuners for television applications, a television signal is up-converted from its original frequency, in the range 50–850 MHz, to a first intermediate frequency, which is in the frequency range around 1 GHz, and is subsequently down-converted, using a second mixer, to a second intermediate frequency of approximately 40 MHz.

The problem now arises for the first IF signal that, during down-conversion using an oscillator signal whose frequency is approximately 40 MHz below the first intermediate frequency, a frequency which is approximately 40 MHz below the oscillator frequency and is thus approximately 80 MHz below the first intermediate frequency is at the same time down-converted to the second intermediate frequency (image frequency). This frequency must be effectively suppressed in the first intermediate frequency.

It is already known for a series-tuned circuit to be combined with a rejection circuit in order to isolate a wanted signal from an adjacent interference signal. In this case, one circuit is tuned to the frequency of the wanted signal and the other circuit is tuned to the frequency of the interference signal, and the circuits are arranged such that the circuit which is tuned to the interference frequency attenuates this frequency, while the circuit which is tuned to the wanted frequency amplifies this frequency. A total of four components are required for a conventional design of each circuit, composed of inductance and capacitance.

SUMMARY

The invention is based on the object of providing a filter circuit which, while having the same selection characteristics, requires a smaller outlay for components than a conventional circuit design.

The solution according to the invention not only reduces the outlay for components, but also makes it possible to dispense with trimming. Particularly in the case of circuits for equipment in the consumer sector, which are produced in large quantities, these two criteria are of considerable importance for the production costs.

When designing the filter circuit according to the invention for frequencies in the UHF range and about, it is intended that the rejection circuit be formed by a λ/4 coaxial stub.

In comparison with circuits using conventional components composed of a discrete capacitor and a discrete inductor, this solution furthermore offers a reduction in the component outlay and, in addition, the advantage of reduced tolerance since, with an appropriate electrical arrangement in the circuit, the resonant frequency of a coaxial stub is not influenced by adjacent electronic or mechanical components. It is thus possible to dimension the coaxial stub even during production for the resonant frequency, so that separate trimming can be obviated.

The λ/4 coaxial stub is preferably connected in parallel with the input of the amplifier stage and is short-circuited at its earthed end, which is at reference-earth potential, λ being the wavelength corresponding to the intermediate frequency.

Since, in the case of this solution, the casing of the λ/4 coaxial stub is at reference-earth potential, the resonant frequency is determined entirely by the mechanical dimensions of the core and casing as well as the dielectric of the coaxial stub.

In this case, the series-tuned circuit can be formed by a series circuit composed of a capacitance and the λ/4 coaxial stub. The capacitance is connected between the input of the amplifier stage and the live end of the λ/4 coaxial stub.

This circuit is suitable whenever the interference frequency or image frequency to be attenuated is lower than the wanted frequency. In this case, the capacitance acts only as a coupling capacitance of the λ/4 coaxial stub at the wanted frequency, while the series resonance at the interference frequency or image frequency is formed by the value of the discrete capacitance and the value of the effective inductance of the coaxial stub. The resonant frequency of this circuit is also not influenced by the environment. It is thus possible to dispense with trimming entirely by using a narrow-tolerance capacitor.

If a ceramic material is used as the dielectric, it is possible to implement the λ/4 coaxial stub with a smaller physical size, a low temperature response and a high Q factor. In the case of a practical design, the relative dielectric constant $\epsilon_r$ of the ceramic material is approximately 88, and the Q factor 200.

The characteristic impedance $Z_0$ of the λ/4 coaxial stub is preferably approximately 3.5 ohms. In conjunction with higher input impedances of the downstream amplifier stage, this results in better selectivity.

The filter circuit according to the invention can be used particularly advantageously in the case of multiple converters for cable or satellite reception in the range from approximately 1 to 2 GHz, in which case the wanted frequency and the image frequency or interference frequency are approximately 78 MHz apart from one another.

The input and output impedances of the amplifier stage are preferably approximately 50 ohms.

A bandpass filter, which comprises a two-circuit ceramic filter tuned to the resonant frequency of the rejection circuit as the mid-frequency, is used for selection of the intermediate frequency.

A development of the invention provides that the upstream filter comprises a plurality of cascaded traps. The attenuation of the interference frequency or image frequency can be further increased in this way.

In the case of a practical refinement, the traps are coupled by means of passive coupling elements, it being possible for the passive coupling elements to be designed as T-attenuators and/or as π-attenuators.

Although a simple parallel circuit composed of two identical traps would only produce 6 dB of additional attenuation, the interposition of coupling elements makes it possible virtually to add the attenuation levels of the individual traps together. In contrast to otherwise normal isolating amplifiers as coupling elements, this solution avoids additional non-linear distortion, as would always occur in the case of isolating amplifiers. In addition, passive coupling elements are considerably more cost-effective and are thus particularly suitable for equipment in the consumer sector. The small additional attenuation of the coupling elements can be accepted without any problems, since it can easily be compensated for by appropriate dimensioning of the amplifier stage, which is present in any case.

Adequate decoupling of the traps with a low insertion loss at the same time is achieved if the passive coupling elements have the same input impedance and output impedance as the amplifier stage and each have an attenuation of 3 dB.

BRIEF DESCRIPTION OF THE DRAWINGS

The invention is explained in the following text with reference to exemplary embodiments which are illustrated in the drawing in which.

DESCRIPTION OF THE PREFERRED EMBODIMENT(S)

Figure 1:
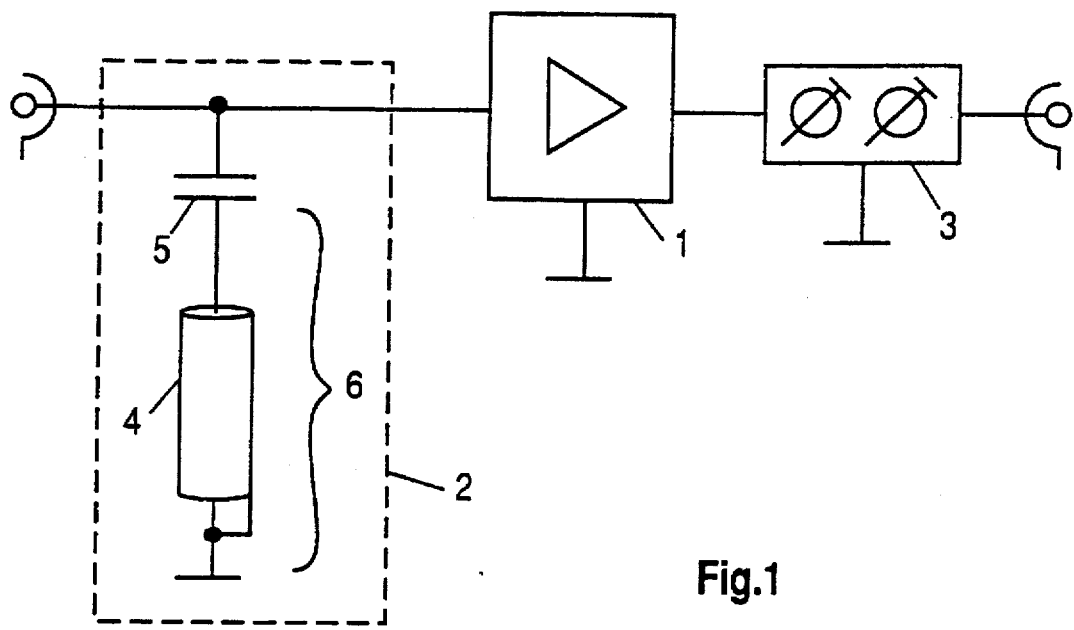
FIG. 1 shows a circuit of a filter circuit according to the invention.

The circuit which is illustrated in FIG. 1 comprises an amplifier stage 1, a two-circuit bandpass filter 3 which is connected downstream of the amplifier stage 1, and a filter 2 which is connected upstream of the amplifier stage 1 and is composed of a combination of a rejection circuit and a series-tuned circuit. The rejection circuit of the filter is formed by a λ/4 coaxial stub 4 which is tuned to the wanted frequency fn and is short-circuited at its earthed end, which is at reference-earth potential. The λ/4 coaxial stub 4 has a dielectric composed of ceramic material with a relative dielectric constant $\epsilon_r$ of approximately 88. Its characteristic impedance $Z_0$ is 3.5 ohms. The electrical length is $l_{el}=l_{ph} \times \sqrt{\epsilon_r}$. A capacitor 5 is arranged between the live end of the λ/4 coaxial stub 4 and an input of the amplifier stage 1. This capacitor 5 is dimensioned such that it forms a series-tuned circuit, tuned to the image frequency, with the λ/4 coaxial stub 4 which acts as an inductance for the image frequency $f_r$. The inductance of the λ/4 coaxial stub 4 is calculated on the basis of $L=Z/\omega$ using $Z=Z_0 \times \tan(1/\lambda \times 2\pi)$, $\omega$ being the angular frequency $\omega=2\pi \times f$, $Z_0$ being the characteristic impedance of the coaxial stub 4, 1 the electrical length of the piece of line, and $\lambda=c/f$ being the wavelength of the frequency. The capacitance required to form the series-tuned circuit is then $C=1/\omega^2 L$.

The amplifier stage 1 is used to decouple the filter 2 from the combined rejection circuit and the series-tuned circuit from the bandpass filter 3. The input impedance and the output impedance of said amplifier stage 1 are both 50 ohms. Not only integrated circuits, which already have this input impedance and output impedance by virtue of their specifications, but also conventional transistor amplifier stages, with a matching network in each case connected upstream and downstream, are suitable for use as the amplifier stage 1.

The bandpass filter 3 which is connected downstream of the amplifier stage 1 is a two-circuit ceramic filter, which is tuned to the resonant frequency of the rejection circuit as the mid-frequency.

Figure 2:
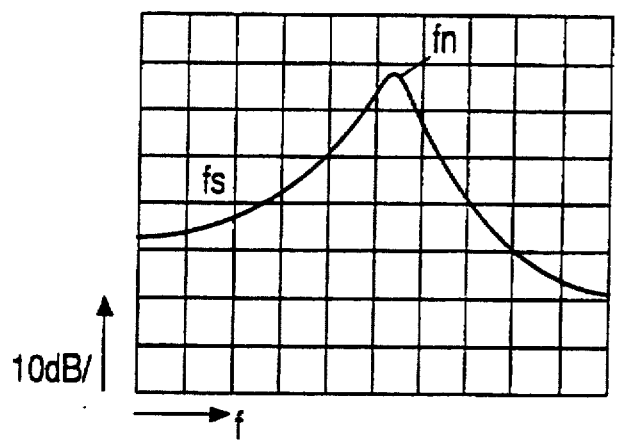
FIG. 2 shows a transfer function of a bandpass filter of the filter circuit.

FIG. 2 shows a transfer function of a bandpass filter 3 of the filter circuit. In this diagram, the wanted frequency at 959 MHz is designated fn, and the image frequency at 881 MHz is designated $f_r$. The image frequency is in this case attenuated by more than 28 dB with respect to the wanted frequency.

Figure 3:
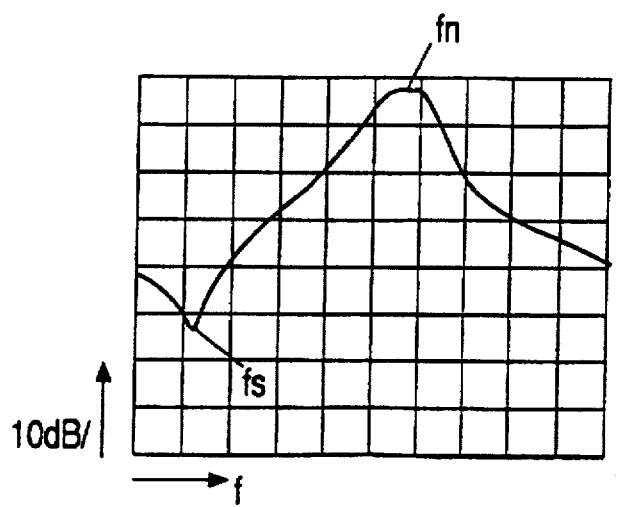
FIG. 3 shows a transfer function of the entire filter circuit according to FIG. 1.

FIG. 3 shows a transfer function of the overall filter circuit according to FIG. 1. This diagram also shows the wanted frequency at $f_n$ and the image frequency at $f_r$. While the pass band is virtually uninfluenced, the image frequency $f_r$ is attenuated by virtually 60 dB in comparison with the wanted frequency $f_n$.

Figure 4:
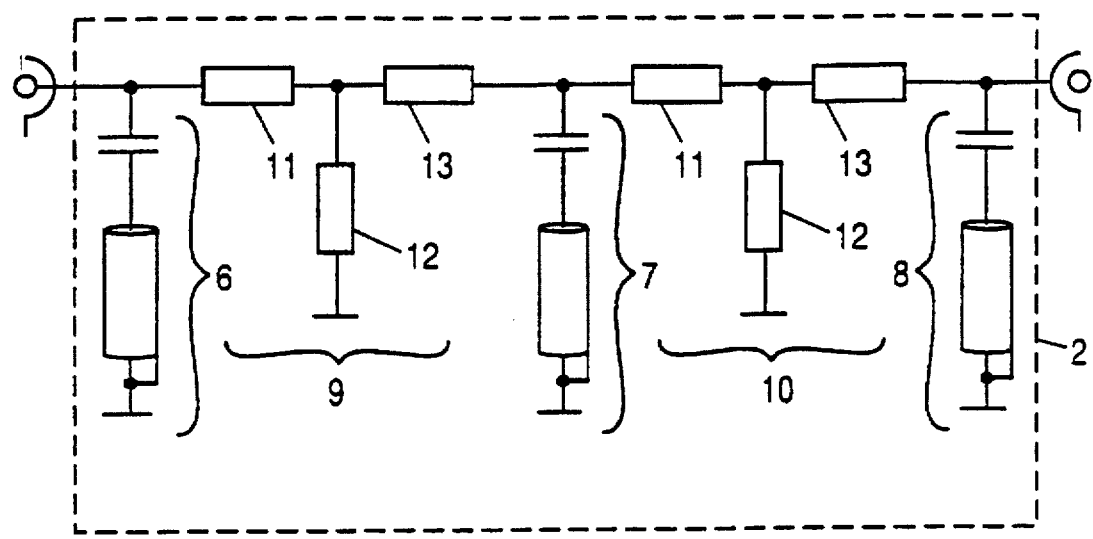
FIG. 4 shows an upstream filter having three cascaded traps.

If the attenuation achieved with the filter circuit according to FIG. 1 is still inadequate, then the upstream filter 2 can be constructed with one or more further cascaded traps 6, 7, 8, instead of with a single trap 6, as can be seen in FIG. 4. The traps 6, 7, 8 are in each case of identical design and are coupled by means of passive coupling elements 9 and 10, which are designed as T-attenuators with resistors 11, 12, 13.

The coupling elements 9 and 10 each have an input impedance and output impedance of 50 ohms and an attenuation of, preferably, 3 dB. On the basis of an interference frequency attenuation of 28 dB for a single trap, an additional 23 dB, that is to say a total of 51 dB, has been determined for two traps coupled via a 3 dB coupling element, and a total of 73 dB for three traps coupled via two 3 dB coupling elements. These attenuation levels are specified relative to the wanted signal, that is to say the insertion loss of 3 dB for one coupling element and 6 dB for two coupling elements have already been subtracted from the absolute attenuation.

We claim:

1. Filter circuit comprising:
   an amplifier stage,
   a bandpass filter coupled downstream of the amplifier stage, and
   a filter coupled upstream of the amplifier stage and has at least one trap comprising a rejection circuit tuned to an intermediate frequency, and a series-tuned circuit tuned to an image frequency,
   the rejection circuit and the series-tuned circuit have a common inductance.

2. Filter circuit according to claim 1 wherein one of the rejection circuit and the series-tuned circuit is formed by a λ/4 coaxial stub.

3. Filter circuit according to claim 2 wherein the λ/4 coaxial stub is connected in parallel with an input of the amplifier stage and is short-circuited at an end which is at reference potential, and λ is the wavelength corresponding to the intermediate frequency.

4. Filter circuit according to claim 2 wherein the series-tuned circuit is formed by a series circuit comprising a capacitor and the λ/4 coaxial stub.

5. Filter circuit according to claim 4 wherein the capacitor is arranged between the input of the amplifier stage and a live end of the λ/4 coaxial stub.

6. Filter circuit according to claim 2 wherein the λ/4 coaxial stub has a dielectric composed of ceramic material.

7. Filter circuit according to claim 6 wherein a relative dielectric constant er of the ceramic material is approximately 88.

8. Filter circuit according to claim 2 wherein a characteristic impedance Zo of the λ/4 coaxial stub is approximately 3.5 ohms.

9. Filter circuit according to claim 1 wherein the resonant frequencies of the rejection circuit and of the series-tuned circuit are in the range from approximately 1 to 2 GHz, the resonant frequency of the series-tuned circuit being approximately 78 MHz below that of the rejection circuit.

10. Filter circuit according to claim 1 wherein the input and an output impedances of the amplifier stage are approximately 50 ohms.

11. Filter circuit according to claim 6 wherein the band-pass filter is a two-circuit ceramic filter tuned to a resonant frequency of the rejection circuit at a mid-frequency.

12. Filter circuit according to claim 1 wherein the upstream filter comprises a plurality of cascaded traps.

13. Filter circuit according to claim 12 wherein traps are coupled by means of passive coupling elements.

14. Filter circuit according to claim 13 wherein the passive coupling elements are T attenuators and/or $\pi$ attenuators.

15. Filter circuit according to claim 13 wherein the passive coupling elements have a same input impedance and output impedance as the amplifier stage.

16. Filter circuit according to claim 13 wherein the passive coupling elements each have an attenuation of 3 db.

* * * * *